United States Patent
Rahim et al.

(10) Patent No.: US 8,698,516 B2
(45) Date of Patent: Apr. 15, 2014

(54) APPARATUS FOR IMPROVING PERFORMANCE OF FIELD PROGRAMMABLE GATE ARRAYS AND ASSOCIATED METHODS

(75) Inventors: Irfan Rahim, Milpitas, CA (US);
Jeffrey T. Watt, Palo Alto, CA (US);
Richard G. Cliff, Los Altos, CA (US);
Andy L. Lee, San Jose, CA (US);
Ping-Chen Liu, Fremont, CA (US)

(73) Assignee: Altera Corporation, San Jose, CA (US)

( * ) Notice: Subject to any disclaimer, the term of this patent is extended or adjusted under 35 U.S.C. 154(b) by 175 days.

(21) Appl. No.: 13/214,144

(22) Filed: Aug. 19, 2011

(65) Prior Publication Data
US 2013/0043902 A1 Feb. 21, 2013

(51) Int. Cl.
*H03K 17/16* (2006.01)
(52) U.S. Cl.
USPC ............. 326/33; 326/32; 326/41; 326/47
(58) Field of Classification Search
USPC .................. 326/31–33, 39, 41, 47
See application file for complete search history.

(56) References Cited

U.S. PATENT DOCUMENTS

| | | | |
|---|---|---|---|
| 7,112,997 B1* | 9/2006 | Liang et al. | 326/81 |
| 7,129,745 B2* | 10/2006 | Lewis et al. | 326/38 |
| 7,348,827 B2* | 3/2008 | Rahim et al. | 327/534 |
| 7,368,976 B2* | 5/2008 | Gupta et al. | 327/534 |
| 7,986,160 B2* | 7/2011 | Hoang et al. | 326/30 |
| 2007/0040577 A1* | 2/2007 | Lewis et al. | 326/41 |
| 2011/0063937 A1* | 3/2011 | Eid et al. | 365/226 |

* cited by examiner

*Primary Examiner* — Jason M Crawford
(74) *Attorney, Agent, or Firm* — Law Offices of Maximilian R. Peterson (57) ABSTRACT

A field programmable gate array (FPGA) includes a set of monitor circuits adapted to provide indications of process, voltage, and temperature for at least one circuit in the FPGA, and a controller adapted to derive a range of body-bias values for the at least one circuit from the indications of process, voltage, and temperature for the at least one circuit. The FPGA further includes a body-bias generator adapted to provide a body-bias signal to at least one transistor in the at least one circuit. The body-bias signal has a value within the range of body-bias values.

20 Claims, 6 Drawing Sheets

APPARATUS FOR IMPROVING PERFORMANCE OF FIELD PROGRAMMABLE GATE ARRAYS AND ASSOCIATED METHODS

CROSS-REFERENCE TO RELATED APPLICATIONS

This patent application relates to U.S. patent application Ser. No. 13/214,147 titled "Apparatus for Configuring Performance of Field Programmable Gate Arrays and Associated Methods," filed on Aug. 19, 2011.

TECHNICAL FIELD

The disclosed concepts relate generally to electronic circuitry and devices such as field-programmable gate arrays (FPGAs) and, more particularly, to apparatus for improving the performance of FPGAs, and associated methods.

BACKGROUND

Advances in electronics have resulted in an increasing number of functions and capabilities being realized by semiconductor devices, for example, integrated circuits (ICs) such as FPGAs. To provide those functions and capabilities, semiconductor devices, such as FPGAs, continue to include an increasing number of transistors.

To reduce cost and yet meet the specifications for more functions and capabilities, semiconductor technology has continued to drive the trend towards higher device density and smaller device geometries. Those trends have in turn resulted in increased power dissipation in ICs, such as FPGAs.

SUMMARY

A wide variety of embodiments according to the disclosed concepts may be used to improve the performance of electronic circuitry, such as FPGAs. According to one exemplary embodiment, an FPGA includes a set of monitor circuits adapted to provide indications of process, voltage, and temperature for at least one circuit in the FPGA, and a controller adapted to derive a range of body-bias values for the at least one circuit from the indications of process, voltage, and temperature for the at least one circuit. The FPGA further includes a body-bias generator adapted to provide a body-bias signal to at least one transistor in the at least one circuit. The body-bias signal has a value within the range of body-bias values.

According to another exemplary embodiment, a method of operating an FPGA includes receiving monitor signals that provide information about process, voltage and temperature relating to at least one circuit in the FPGA, and determining a range of body-bias values based at least in part on the information about process, voltage and temperature. The method further includes generating a body-bias signal having a value within the range of body-bias values, and applying the body-bias signal to at least one transistor in the at least one circuit.

According to yet another exemplary embodiment, an FPGA includes at least two monitor circuits adapted to provide indications of process, voltage, and temperature for at least two circuits in the FPGA, respectively. The FPGA further includes a controller adapted to derive at least two ranges of body-bias values, respectively, for the at least two circuits, from the indications of process, voltage, and temperature, and from configuration information for the at least two circuits. The FPGA in addition includes a body-bias generator adapted to provide at least two body-bias signals to at least one transistor in, respectively, the at least two circuits. The body-bias signals have values within the respective range of body-bias values of the at least two circuits.

BRIEF DESCRIPTION OF THE DRAWINGS

The appended drawings illustrate only exemplary embodiments and therefore should not be considered as limiting its scope. Persons of ordinary skill in the art appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to electronic circuitry and devices such as field-programmable gate arrays (FPGAs) and, more particularly, to apparatus for improving the performance of FPGAs, and associated methods. One aspect of the disclosed concepts relates to adjusting or providing body-bias levels of at least some part, block, circuit, or resource in an FPGA based on monitored levels or indications of process, voltage, and temperature (PVT). Generally speaking, process, voltage, and temperature are monitored for one or more circuits in the FPGA to determine indications of process, voltage, and temperature in order to provide body-bias signals to one or more circuits in the FPGA.

A range of body-bias values are then determined, based at least in part on the indications or monitored values of process, voltage, and temperature. In some embodiments, configuration information about the circuit(s) may also be taken into account. For example, the range of body-bias values may be determined based on whether a circuit or block has been configured for relatively low-speed and relatively low power-consumption or whether the circuit or block has been configured for relatively high speed and relatively high power-consumption. Generally, the configuration information may include information about desired, maximum, minimum operating speed and/or power consumption of the circuit, block, etc.

A body-bias signal is provided or applied to at least one transistor in one or more of the respective circuit(s). The body-bias signal(s) have values within the respective ranges of body-bias values. The body-bias signal(s) are selected so as to improve power consumption or dissipation of the circuit(s) and, therefore, the FPGA. In some embodiments, configuration information about the circuit(s) may also be taken into account in determining the body-bias value(s), as described above.

Figure 1:
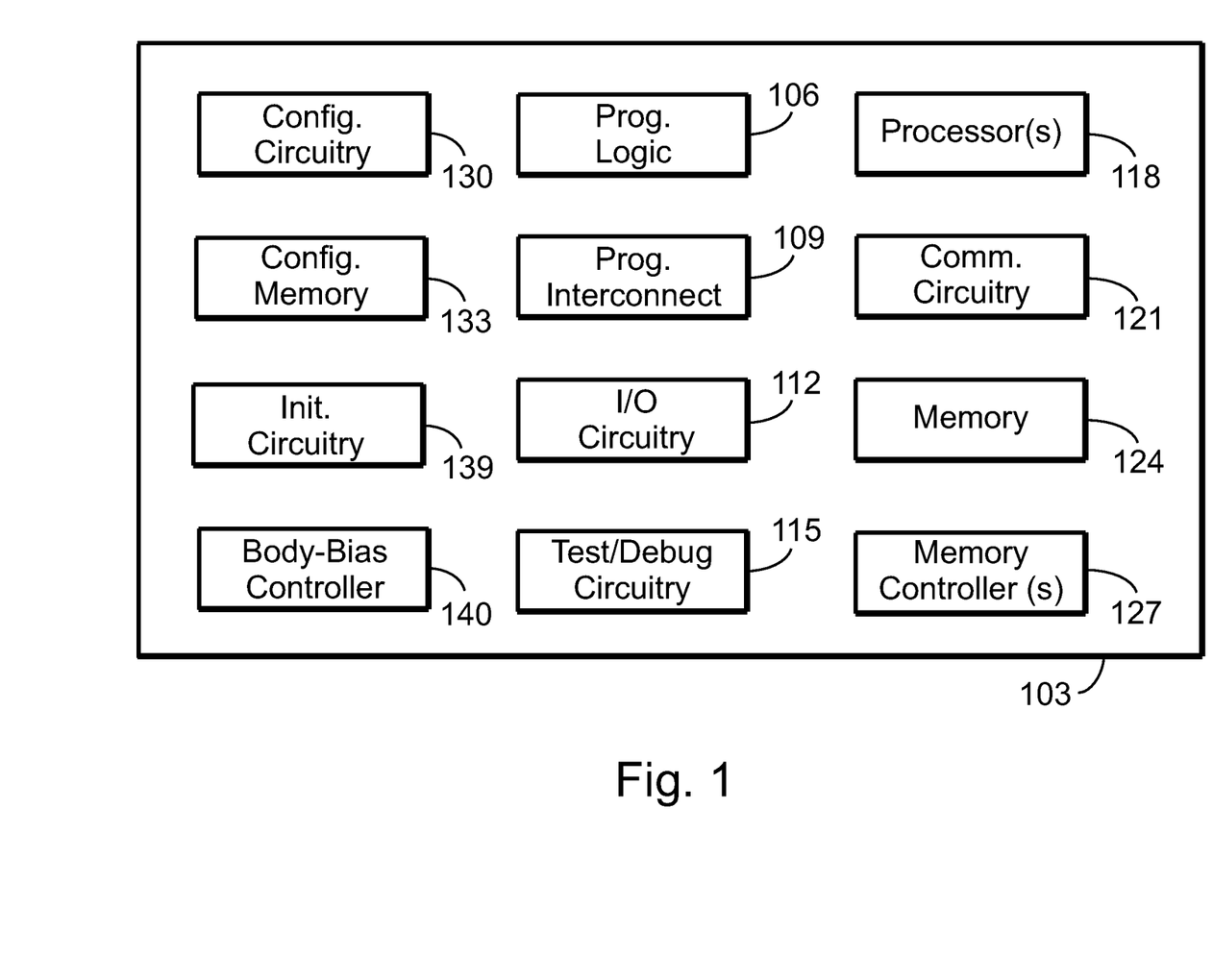
FIG. 1 illustrates a block diagram of an FPGA according to an exemplary embodiment.

FIG. 1 illustrates a general block diagram of an FPGA 103 according to an exemplary embodiment. FPGA 103 includes configuration circuitry 130, configuration memory (CRAM)

133, body-bias controller 140, programmable logic 106, programmable interconnect 109, and I/O circuitry 112. In addition, FPGA 103 may include test/debug circuitry 115, one or more processors 118, one or more communication circuitry 121, one or more memories 124, one or more controllers 127, and initialization circuit 139, as desired.

Note that the figure shows a general block diagram of FPGA 103. Thus, FPGA 103 may include other blocks and circuitry, as persons of ordinary skill in the art understand. Examples of such circuitry include clock generation and distribution circuits, and the like. Furthermore, FPGA 103 may include analog circuitry, other digital circuitry, and/or mixed-signal circuitry, fuses, anti-fuses, and the like, as desired.

Programmable logic 106 includes blocks of configurable or programmable logic circuitry, such as look-up tables (LUTs), product-term logic, pass gates, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside FPGA 103 (for example, by using pass gates and/or MUXs). In some embodiments, programmable logic 106 and/or programmable interconnect 109 may include fuses and/or anti-fuses to provide additional flexibility or programmability.

Initialization circuit 139 may cause the performance of various functions at reset or power-up of FPGA 103. At or after power-up, FPGA 103 obtains configuration information, typically from an external device. Based on the configuration information, various blocks or devices within the FPGA core or fabric, or other blocks or resources in FPGA 103, are configured or programmed. Examples include programmable logic 106 and programmable interconnect 109.

I/O circuitry 112 may constitute a wide variety of I/O devices or circuits. I/O circuitry 112 may couple to various parts of FPGA 103, for example, programmable logic 106 and programmable interconnect 109. I/O circuitry 112 provides a mechanism and circuitry for various blocks within FPGA 103 to communicate with external circuitry or devices.

Test/debug circuitry 115 facilitates the testing and troubleshooting of various blocks and circuits within FPGA 103. Test/debug circuitry 115 may include a variety of blocks or circuits known to persons of ordinary skill in the art. For example, test/debug circuitry 115 may include circuits for performing tests after FPGA 103 powers up or resets, as desired. Test/debug circuitry 115 may also include coding and parity circuits, as desired.

FPGA 103 may include one or more processors 118. Processor 118 may couple to other blocks and circuits within FPGA 103. Processor 118 may receive data and information from circuits within or external to FPGA 103 and process the information in a wide variety of ways, as persons skilled in the art understand. One or more of processor(s) 118 may constitute a digital signal processor (DSP). DSPs allow performing a wide variety of signal processing tasks, such as compression, decompression, audio processing, video processing, filtering, and the like, as desired.

FPGA 103 may also include one or more communication circuit(s) 121. Communication circuit(s) 121 may facilitate data and information exchange between various circuits within FPGA 103 and circuits external to FPGA 103, as persons of ordinary skill in the art understand. Examples of communication circuit 121 include transceivers, network interface circuits, etc.

FPGA 103 may further include one or more memories 124 and one or more memory controller(s) 127. Memory 124 allows the storage of various data and information (such as user-data, intermediate results, calculation results, etc.) within FPGA 103. Memory 124 may have a granular or block form, as desired.

Memory controller 127 allows interfacing to, and controlling the operation and various functions of, circuitry outside the FPGA. For example, memory controller 127 may interface to and control an external synchronous dynamic random access memory (SDRAM).

Body-bias controller 140 provides body-bias values for one or more circuits in FPGA 103. More specifically, as noted above, the body-bias values are selected from ranges of body-bias values for one or more circuits in FPGA 103. The body-bias values determine the performance of one or more transistors, or groups of transistors, within FPGA 103. For example, the body-bias values affect the speed of operation of the transistor(s), power dissipation of the circuit(s) in which the transistor(s) reside, etc.

Figure 2:
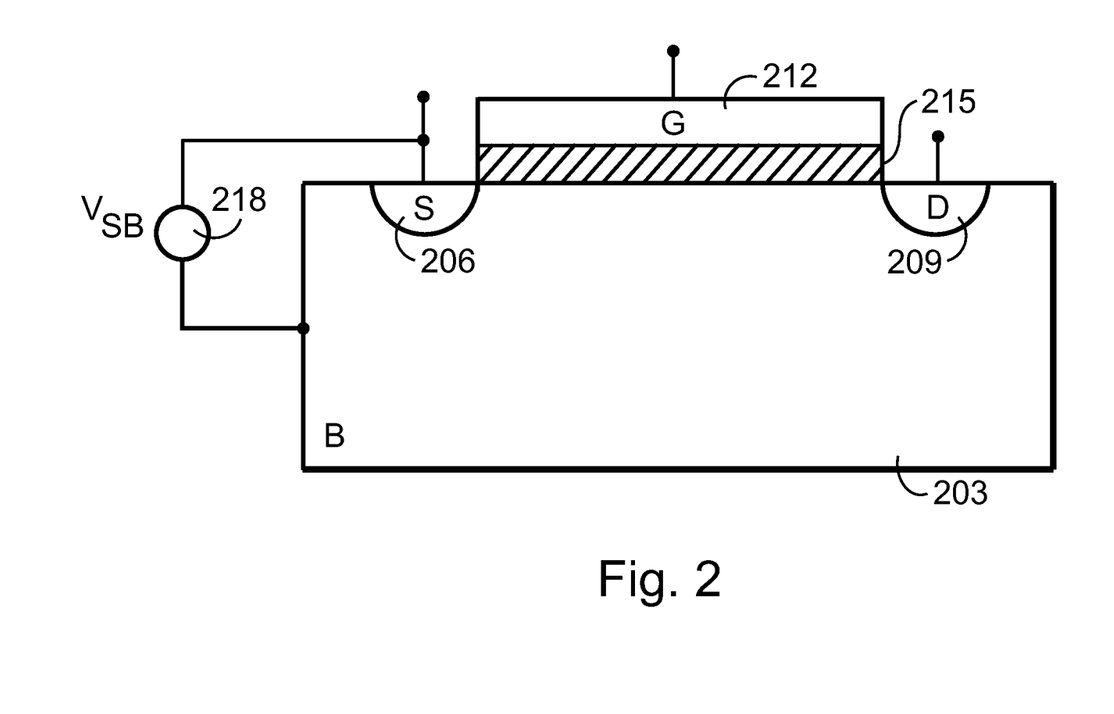
FIG. 2 shows a metal oxide semiconductor (MOS) transistor used in FPGAs according to exemplary embodiments.

FIG. 2 shows a MOS transistor used in FPGAs according to exemplary embodiments. The MOS transistor includes body (or substrate) region 203, source region 206, drain region 209, gate insulator 215, and gate 212. The drain current of the MOS transistor in the saturation region of operation depends on the threshold voltage and the gate-to-source voltage of the transistor:

$$i_D = K(v_{GS} - V_T)^2, \quad (1)$$

where
$i_D$=the total drain current (i.e., including AC and DC components),
K=a constant,
$v_{GS}$=the total gate-to-source voltage (i.e., including AC and DC components), and
$V_T$=the threshold voltage.

The threshold voltage, $V_T$, depends on a number of factors, such as the voltage between source region 206 and body region 203 of the transistor. The following equation provides the threshold voltage as a function of the body-to-source voltage:

$$V_T = V_{T(0)} + \gamma\{\sqrt{2\phi_F - v_{BS}} - \sqrt{2\phi_F}\}. \quad (2A)$$

Alternatively, one may write Equation 2A in terms of the source-to-body voltage:

$$V_T = V_{T(0)} + \gamma\{\sqrt{2\phi_F + v_{SB}} - \sqrt{2\phi_F}\}. \quad (2B)$$

where
$V_{T(o)}$=the threshold voltage with the source-to-body voltage (or body-to-source voltage) set to zero,
$\gamma$=the body factor, a constant that depends on the doping levels of the body,
$\phi_F$=a constant,
$v_{BS}$=the total body-to-source voltage (i.e., including AC and DC components), and
$v_{SB}$=the total source-to-body voltage (i.e., including AC and DC components).

Note that when the body-to-source voltage, $v_{BS}$ (or source-to-body voltage, $v_{SB}$) equals zero, the threshold voltage, $V_T$, equals $V_{T(o)}$.

As Equation 2B shows, for a finite body factor, $\gamma$, the transistor's threshold voltage increases as the source-to-body voltage, $v_{SB}$, increases. Equation 1, however, indicates that for a given gate-to-source voltage an increase in the threshold voltage decreases the drain current, $i_D$, of the transistor. In other words, according to Equations 1 and 2B, for a constant gate-to-source-voltage, $v_{GS}$, an increase in the source-to-body voltage, $v_{SB}$, causes an increase in the threshold voltage, $V_T$.

An increased threshold voltage, $V_T$, in turn causes a decrease in the quantity ($v_{GS}-V_T$) and, consequently, a decrease in the drain current, $i_D$, of the transistor. Thus, for a constant gate-to-source-voltage, $v_{GS}$, an increase in the source-to-body voltage, $v_{SB}$, causes a decrease in the current-drive capability (one measure of performance) of the transistor. The decreased current-drive capability of the transistor in turn leads to slower circuit operation and, ultimately, to slower operation of the FPGA that includes the transistor.

The power dissipation of the transistor also varies according to changes in its threshold voltage. More specifically, a smaller threshold voltage increases the OFF-state leakage current ($I_{off}$) of the transistor, and vice-versa. The $I_{off}$ of the transistor affects its static (non-switching) power dissipation. In addition, a smaller threshold voltage decreases the dynamic or switching power dissipation of the transistor. Thus, changing the threshold voltage by adjusting the body bias affects the power dissipation of the MOS transistor.

Furthermore, for a given supply voltage, $V_{DD}$, an increase in the threshold voltage, $V_T$, limits the maximum voltage that the transistor can transmit when operating as a pass transistor. In other words, if the threshold voltage, $V_T$, increases to the point that it equals or exceeds the gate-to-source-voltage, $v_{GS}$, the drain current reduces to zero. Thus, a voltage applied to the drain of the transistor, for example, a voltage that corresponds to a logic 1 level, fails to properly transmit to the source of the transistor. Consequently, the transistor fails to operate reliably as a pass transistor.

Note that the source-to-body voltage, $v_{SB}$, may be positive or negative. A positive source-to-body voltage, $v_{SB}$, provides forward body-bias. Conversely, a negative source-to-body voltage, $v_{SB}$, causes reverse body-bias of the transistor. Part of the forward body-bias flows into the body or substrate. Nevertheless, forward body-bias can increase or improve operating speed of the transistor in the presence of relatively high leakage currents.

As the above description shows, one may affect the performance of the MOS transistor by adjusting its body bias and hence its source-to-body voltage (ultimately resulting in a change in its threshold voltage). Adjusting the body bias affects performance measures such as current-drive capability, speed of operation, power dissipation, etc.

In exemplary embodiments, one may adjust the body bias of individual transistors, individual circuits or blocks within the FPGA, groups of transistors or blocks, or even the entire FPGA, as desired. Furthermore, one may control the body bias of individual NMOS and PMOS transistors, or the body biases of groups of NMOS and PMOS transistors, as desired. The following description provides the details.

As noted, in some embodiments, the fabric or core of an FPGA may be allocated as circuit blocks corresponding to one or more configurations. The fabric or core of FPGA 103 may take a variety of forms. In some embodiments, the core circuitry of FPGA 103 includes, among other circuitry, programmable logic 106 and programmable interconnect 109.

Programmable logic 106 and programmable interconnect 109 often reside within FPGA 103 in an array or regular structure, for example, a two-dimensional array. Thus, in some embodiments, the fabric or core of FPGA 103 may be arranged in rows and columns.

Figure 3:
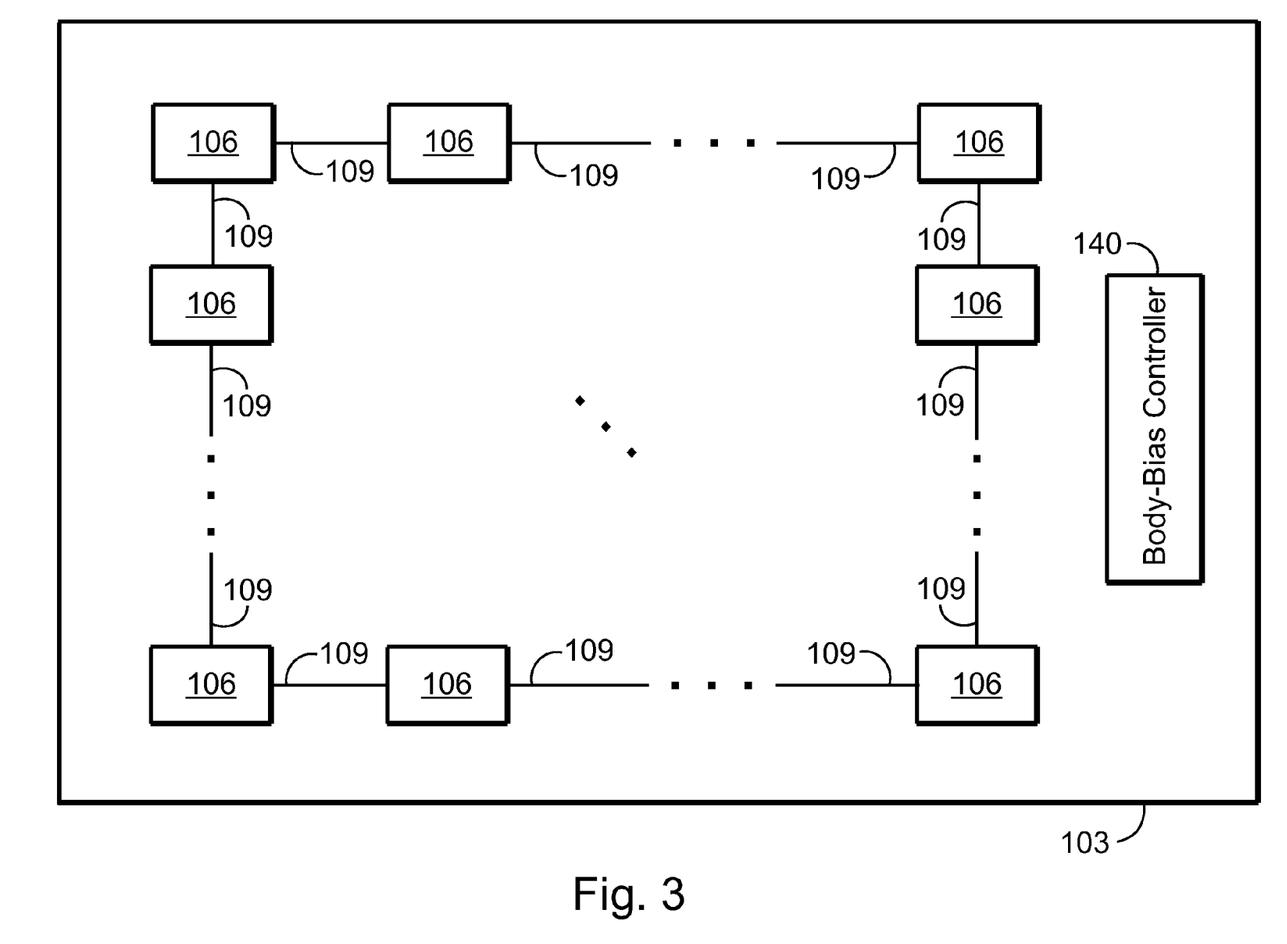
FIG. 3 depicts a floor-plan of an FPGA according to an exemplary embodiment.

FIG. 3 depicts a floor-plan of FPGA 103 according to an exemplary embodiment. FPGA 103 includes programmable logic 106 arranged as a two-dimensional array. Programmable interconnect 109, arranged as horizontal interconnect segments and vertical interconnect segments, couples the blocks of programmable logic 106 to one another.

One may place the blocks in a particular manner so as to implement a user's design, as persons of ordinary skill in the art understand. A block, part of a block, or a set of blocks may constitute a tile or region of FPGA 103. FPGA 103 may thus include a number of tiles, arranged in a desired configuration (e.g., as two halves, four quadrants, etc.), as persons of ordinary skill in the art understand. In other embodiments, FPGA 103 may include rows and/or columns of circuitry or blocks of circuitry.

Figure 4:
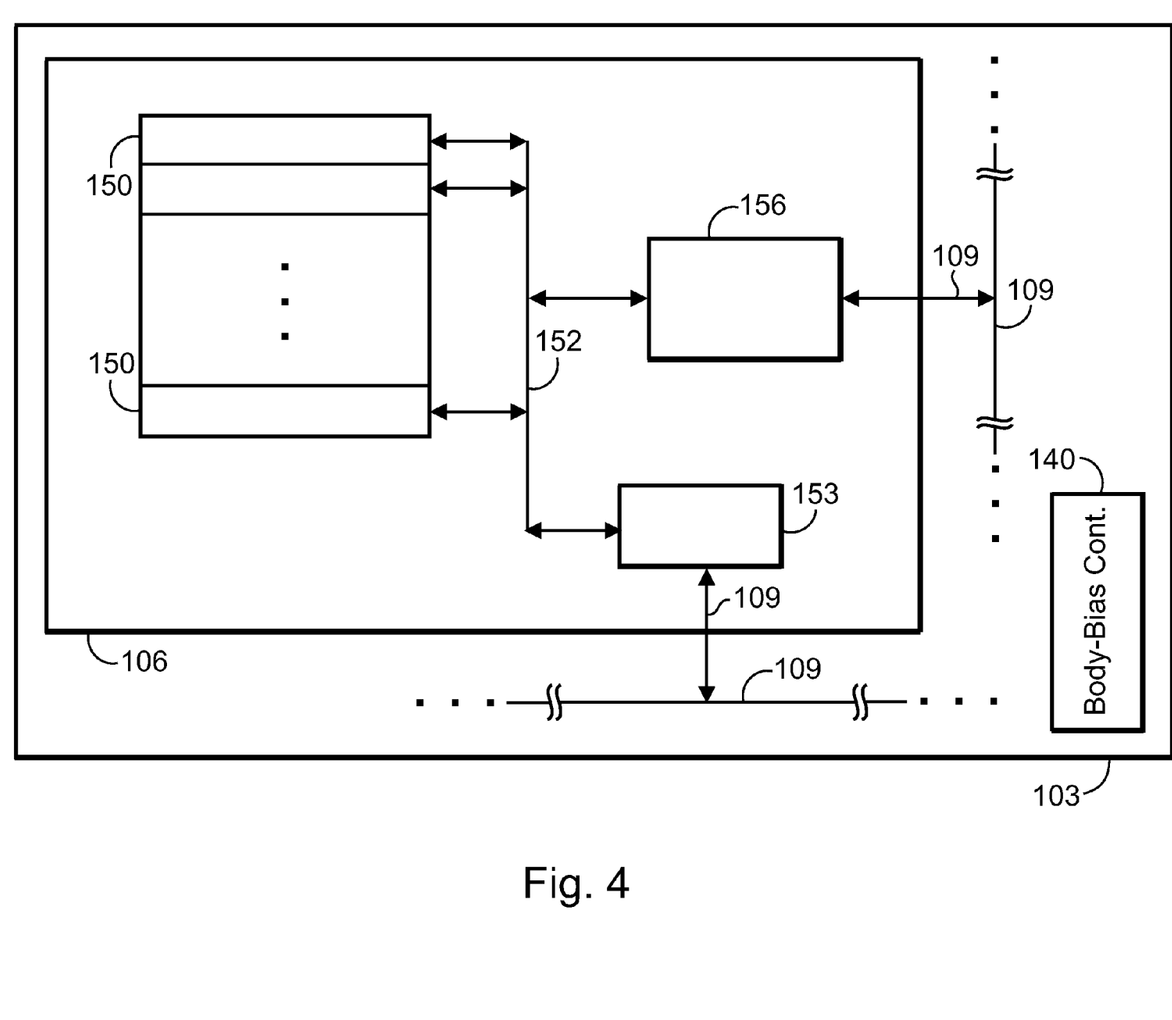
FIG. 4 illustrates a block diagram of programmable logic and programmable interconnect in an FPGA according to an exemplary embodiment.

The core or fabric of FPGA 103 may include a more granular structure of programmable circuitry (e.g., programmable logic, programmable interconnect, etc.). FIG. 4 shows a block diagram of programmable logic 106 and programmable interconnect 109 in FPGA 103 according to an exemplary embodiment. In the exemplary embodiment shown, programmable logic 106 includes logic elements or programmable logic elements, circuits, or blocks 150, local interconnect 152, interface circuit 153, and interface circuit 156.

Logic elements 150 provide configurable or programmable logic functions, for example, LUTs, flip-flops, registers, product-term logic, etc., as persons of ordinary skill in the art understand. Local interconnect 152 provides a configurable or programmable mechanism for logic elements 150 to couple to one another or to programmable interconnect 109 (sometimes called "global interconnect"), as desired. Interface circuit 156 and interface circuit 153 provide a configurable or programmable way for programmable logic 106 block of circuitry to couple to programmable interconnect 109 (and hence to other programmable logic 106).

Interface circuit 156 and interface circuit 153 may include MUXs, DEMUXs, registers, buffers, pass gates, drivers, and the like, as persons of ordinary skill in the art understand. At a higher level, one may combine a number of logic elements 150 and associated circuitry to realize a larger programmable block. One may repeat this process as desired or appropriate in a given situation to generate programmable blocks of circuitry with a desired level of granularity of programmability.

Various circuits or blocks within FPGA 103 may be treated as circuit elements and have corresponding levels of body bias. In exemplary embodiments, a variety of levels of granularity for the allocation of circuit elements may be used. For example, in some embodiments, one may treat individual transistors (e.g., a transistor acting as a pass-gate) as a circuit element. As another example, circuit elements in programmable logic 106 may have one or more body-bias levels.

Furthermore, one may adjust the body bias of each portion or block of circuitry independently of others, on an individual or collective basis, as desired. Within each portion or block of circuitry, one may adjust the body bias of each sub-block or transistor, or groups of sub-blocks or transistors, on an individual or collective basis, as desired.

In some embodiments, a logic element (or a component or block within the logic element) or a set of logic elements may have a corresponding body-bias level. Other examples will be apparent to persons of ordinary skill in the art, for example, blocks of logic elements, tiles, quadrants, rows, columns, etc.

One may adjust the body bias of all or a portion of the following circuitry within an FPGA according to exemplary embodiments: one or more of the blocks in FIG. 1 (e.g., programmable logic 106, programmable interconnect 109, etc.); one or more logic elements 150 within one or more programmable logic blocks 106; one or more interface circuits 256 and/or 259, within one or more programmable logic blocks 106; one or more local interconnect within one or more programmable logic 106; and one or more MUXs, drivers, buffers, etc., within one or more interface circuits 256 and/or 259.

Similarly, various parts or blocks of circuitry within programmable interconnect 109 may have corresponding body-bias level(s). For instance, one or more local interconnects may have corresponding body-bias level(s). As another example, one or more global interconnects (or parts of one or more such interconnects) may have corresponding body-bias level(s). Other examples will be apparent to persons of ordinary skill in the art, depending on factors such as the architecture of the FPGA in question, the level of granularity of the FPGA's core or fabric, etc.

In addition to, or instead of, programmable logic 106 and programmable interconnect 109, other circuits or blocks within FPGA 103 may have corresponding body-bias level(s). For example, in some embodiments, memory 124 may be implemented as blocks of memory within FPGA 103. One or more blocks of memory within memory 124 may have corresponding body-bias level(s).

Similar possibilities exist with respect to processor(s) 118, communication circuit(s) 121, I/O circuitry 112, etc. Generally speaking, parts, or all, of one or more circuits or blocks of circuits in FPGA 103 may have corresponding body-bias level(s) that may be adjusted or set according to exemplary embodiments.

As noted above, one may make the body-bias adjustments in any desired level of granularity. In other words, one may make the adjustments applicable to individual transistors, groups of transistors, sub-blocks, blocks, or the entire FPGA, as desired, and as applicable. For example, one may make body-bias adjustments to one or more NMOS transistors independently of one or more PMOS transistors, as desired.

Furthermore, one may adjust the body bias of one element in FPGA 103 independently of all other elements, as desired. As persons of ordinary skill in the art understand, one may adjust the body bias of some parts of a FPGA, and yet provide a fixed or default body bias for other parts of the FPGA, as desired.

Figure 5:
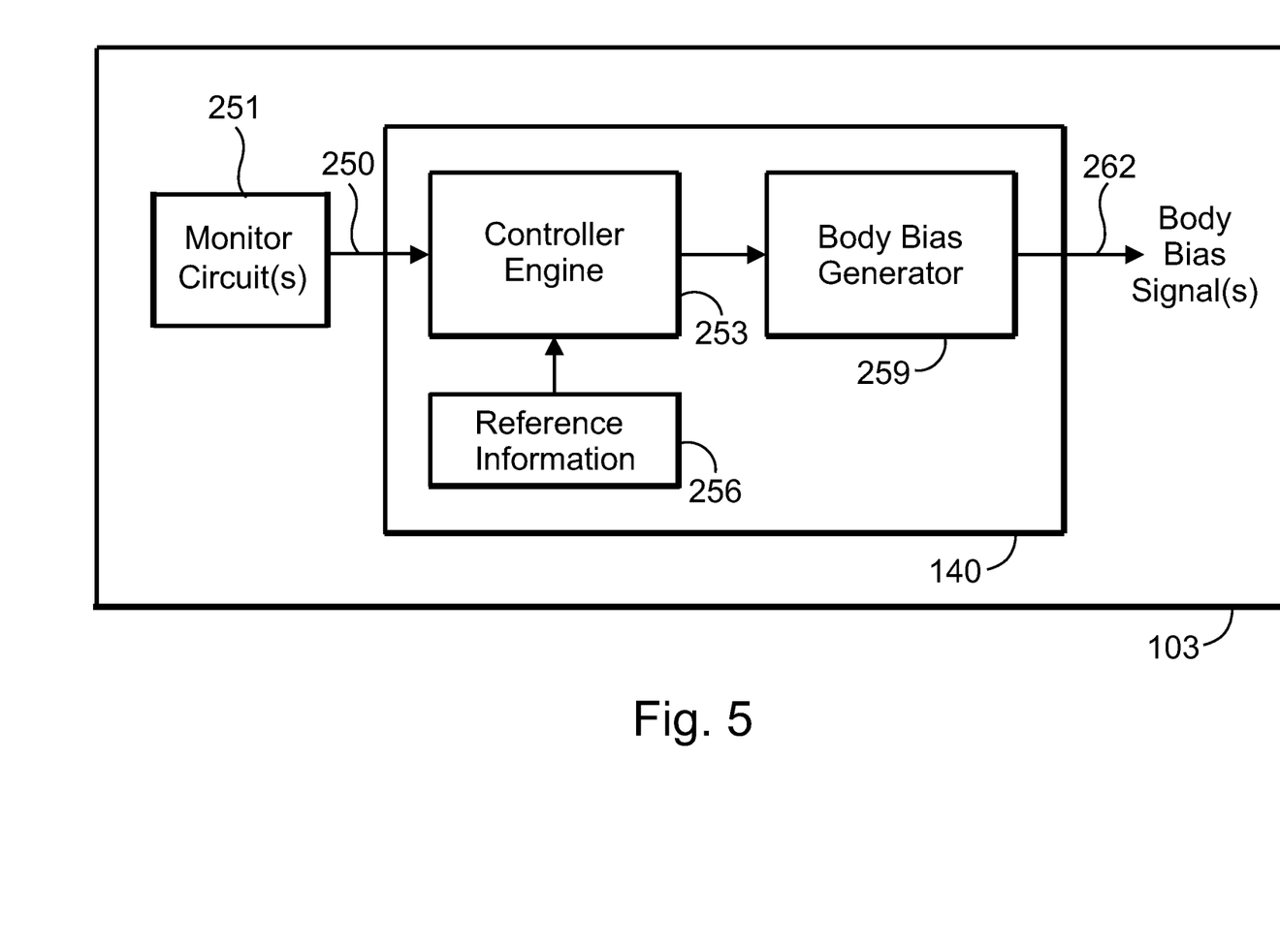
FIG. 5 shows a block diagram of a body-bias controller according to an exemplary embodiment.

FIG. 5 shows a block diagram of a body-bias controller 140 according to an exemplary embodiment. Body-bias controller 140 includes a controller engine or circuit 253. Controller engine 253 receives as one or more inputs monitor input signal(s) 250 from one or more monitor circuits 251.

A number of monitor circuits may be used within FPGA 103, as desired. The number and location of the monitor circuits depends on several factors, such as the level of granularity of body-bias adjustment or control. For example, in some embodiments, a monitor circuit may be used for each FPGA resource whose body-bias is sought to be controlled or adjusted. The location of FPGA resources therefore determines the location of the monitor circuits within FPGA 103. For example, if the FPGA resources at issue constitute programmable logic and programmable interconnect within the core or fabric of FPGA 103, then the monitor circuits may be dispersed within the FPGA 103, for instance in the two-dimensional pattern shown in FIG. 3.

In some embodiments, a monitor circuit may be used for a set of FPGA resources whose body-biases are sought to be controlled or adjusted. The location of FPGA resources therefore determines an appropriate location of the monitor circuit in this situation. For example, the monitor circuit may be located centrally to, or near the resources.

Monitor signal(s) 250 include indications of one or more characteristics of the process, voltage, and temperature of one or more resources within FPGA 103. Examples of such resources include circuits, transistors, blocks, and the like.

The characteristics of the process may include one or more characteristics or parameters relating to the fabrication process used to fabricate FPGA 103 generally, and the respective circuit, transistor, block, and the like, specifically. Examples of such parameters include nominal threshold voltages, measures of speed of operation of transistors, current-drive capability of transistors, etc.

The temperature characteristics may generally include a measure of the temperature of the respective circuit, transistor, block, and the like. For example, the temperature characteristics may include one or more junction temperatures, an average of such temperatures, and the like.

The voltage characteristics may generally include the supply voltage for the respective circuit, transistor, block, and the like. In some embodiments, the monitor circuit monitors or measures the DC component of the supply voltage. In some embodiments, the monitor circuit monitors or measures the DC and AC components of the supply voltage. In the latter example, the monitor circuit and, hence, body-bias controller 140, can respond to ripple or transients present in the supply voltage.

Controller engine 253 receives body-bias information from reference information circuit 256. Reference information circuit 256 may take a variety of forms. In some embodiments, reference information circuit 256 may constitute a look-up table, memory device, and the like, as persons of ordinary skill in the art understand. In some embodiments, reference information circuit 256 may provide the reference information using one or more formulas. Controller engine 253 uses the monitor input signals 250 and information from the reference information circuit 256 to determine range(s) of body-bias level(s) for the respective circuit(s), transistor(s), block(s), and the like in FPGA 103.

In one exemplary embodiment, reference information circuit 256 contains look-up information for appropriate ranges of body-bias. Controller engine 253 uses the monitor input signals 250 to determine a look-up index that it uses to retrieve one or more body-bias ranges from reference information circuit 256.

In some embodiments, configuration information about the respective circuit(s), transistor(s), block(s), and the like may also be taken into account. For example, the range of body-bias values may be determined based on whether a circuit or block has been configured for relatively low-speed and relatively low power-consumption or whether the circuit or block has been configured for relatively high speed and relatively high power-consumption. Generally, the configuration information may include information about desired, maximum, minimum operating speed and/or power consumption of the circuit, block, etc.

Controller engine 253 uses the body-bias range information and the monitored input signals to determine a body-bias level for the respective resources, such as circuit(s), transistor(s), block(s), and the like in FPGA 103. For example, at relatively low temperatures, a relatively high forward body-bias upper limit (upper limit of the body-bias range) may be used. Conversely, at relatively high temperatures, a relatively low forward body-bias lower limit (lower limit of the body-bias range) may be used. In some embodiments, configuration information about the respective circuit(s), transistor(s), block(s), and the like may also be taken into account in determining the body-bias value(s), as described above.

Body-bias generator 259 provides one or more body-bias signals 262 to the respective resources at relatively low temperatures, a relatively high forward body-bias upper limit (upper limit of the body-bias range) may be used. Depending on the range for the body-bias, controller engine 253 may cause body-bias generator 259 to adjust the body-bias signal(s) such that the body-bias level(s) remain within the determined range. In this manner, the performance, such as power dissipation, speed of operation, etc. of one or more parts, blocks, circuits, transistors, and the like, of FPGA 103 may be controlled, improved, or optimized by dynamically adjusting or controlling the respective body-bias level(s).

Figure 6:
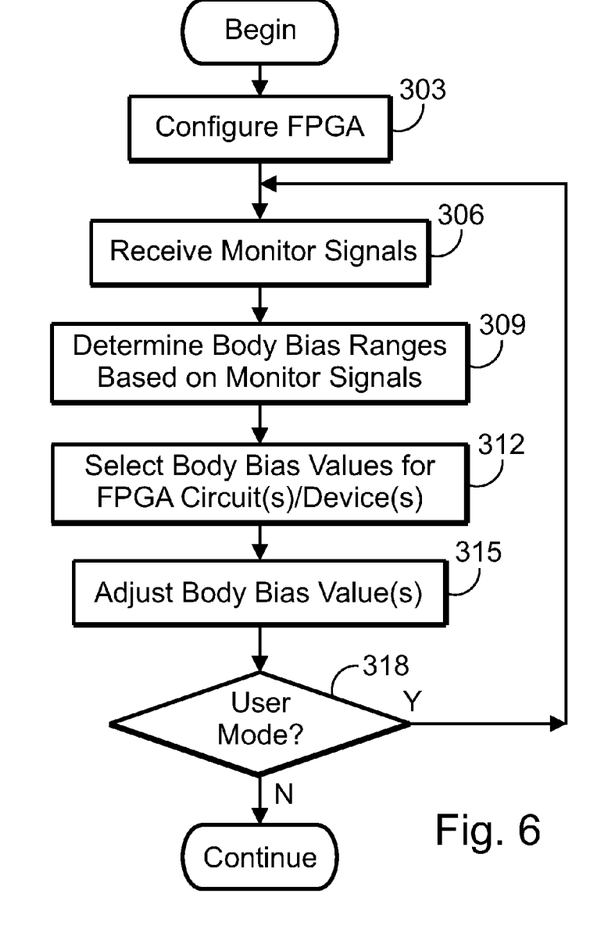
FIG. 6 depicts a flow diagram for using body-bias ranges according to an exemplary embodiment.

FIG. 6 depicts a flow diagram for using body-bias ranges according to an exemplary embodiment. At 303, the FPGA is configured using data relating to a user's design, to be implemented via the FPGA's resources, such as those described above. Once configured, the FPGA may be placed in user mode, i.e., implement the user's circuit, desired functionality, etc.

At 306, monitor signals are received or obtained. The monitor signals may constitute or provide indications of, or information about, the levels and/or characteristics of process, voltage, and temperature in a resource, such as circuit(s), transistor(s), block(s), and the like in FPGA 103.

At 309, one or more body-bias ranges are determined, based on the monitor signals. The body-bias ranges may be determined in a variety of ways, such as look-up data or tables, formulas, etc., as persons of ordinary skill in the art understand. Configuration information (e.g., relatively high or low speed of operation) for the respective FPGA resource(s) may also be taken into account in the determination of body-bias ranges.

For example, the range of body-bias values may be determined based on whether an FPGA resource has been configured for relatively low-speed and relatively low power-consumption or whether the resource has been configured for relatively high speed and relatively high power-consumption. Generally, the configuration information may include information about desired or maximum or minimum operating speed and/or power consumption of the resource, etc.

At 312, body-bias values or levels are determined for the respective FPGA resource, e.g., circuit(s), transistor(s), block(s). At 315, the body-bias value(s) of the respective FPGA resource are adjusted or controlled or programmed, for example, by using the body-bias values or levels determined at 312. Similar to the determination at 309, configuration information (e.g., relatively high or low speed of operation) for the respective FPGA resource(s) may also be taken into account in the determination of body-bias levels or values at 315.

At 318, a check is made to determine whether the FPGA is operating in user mode. If so, control returns to 306. Using the technique illustrated in the flow diagram, the body-bias of one or more FPGA resources may be adjusted, programmed, or controlled. In this manner, the performance, such as power dissipation, speed of operation, etc. of one or more parts, blocks, circuits, transistors, and the like, of FPGA 103 may be controlled, improved, or optimized by dynamically adjusting or controlling the respective body-bias level(s).

Although the above disclosure describes in part techniques and circuitry for improving the performance of FPGAs, the disclosed concepts apply generally to ICs with programmable or configurable circuitry. Such ICs may be known to persons of ordinary skill in the art as programmable logic devices (PLDs), complex PLDs (CPLDs), and the like.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art understand. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art may use certain features of the disclosed concepts independently of the use of other features, without departing from the scope of the disclosed concepts.

The invention claimed is:

1. A field programmable gate array (FPGA), comprising:
a set of monitor circuits adapted to provide indications of process, voltage, and temperature for at least one circuit in the FPGA;
a controller adapted to derive a range of body-bias values for the at the at least one circuit from the indications of process, voltage, and temperature for the at least one circuit; and
a body-bias generator adapted to provide a body-bias signal to at least one transistor in the at least one circuit, the body-bias signal having a value within the range of body-bias values.

2. The FPGA according to claim 1, wherein the at least one circuit comprises programmable logic.

3. The FPGA according to claim 1, wherein the at least one circuit comprises programmable interconnect.

4. The FPGA according to claim 1, wherein the body-bias signal causes forward body-bias to be applied to the at least one transistor.

5. The FPGA according to claim 1, wherein the body-bias signal causes reverse body-bias to be applied to the at least one transistor.

6. The FPGA according to claim 1, the controller is adapted to derive the range of body-bias values using a look-up table.

7. The FPGA according to claim 1, wherein indications of process comprise one or more parameters relating to a fabrication process used to fabricate the FPGA.

8. The FPGA according to claim 1, wherein indications of temperature comprise at least one temperature of the at least one circuit.

9. The FPGA according to claim 1, wherein indications of voltage comprise a power supply voltage of the at least one circuit.

10. The FPGA according to claim 9, wherein the power supply voltage comprises a DC component of the power supply voltage.

11. The FPGA according to claim 9, wherein the power supply voltage comprises DC and AC components of the power supply voltage.

12. A method of operating a field programmable gate array (FPGA), the method comprising:
receiving monitor signals that provide information about process, voltage and temperature relating to at least one circuit in the FPGA;
determining a range of body-bias values based at least in part on the information about process, voltage and temperature;

generating a body-bias signal having a value within the range of body-bias values; and applying the body-bias signal to at least one transistor in the at least one circuit.

13. The method according to claim 12, wherein the monitor signals provide information about a semiconductor fabrication process used to fabricate the FPGA.

14. The method according to claim 12, wherein the monitor signals provide information about at least one temperature of the at least one circuit.

15. The method according to claim 12, wherein the monitor signals provide information about at least one supply voltage of the at least one circuit.

16. The method according to claim 15, wherein information about at least one supply voltage comprises: (a) a DC component of the at least one supply voltage; (b) an AC component of the at least one supply voltage; or (c) DC and AC components of the at least one supply voltage.

17. A field programmable gate array (FPGA), comprising:
first and second monitor circuits adapted to provide indications of process, voltage, and temperature for first and second circuits in the FPGA, respectively;

a controller adapted to derive first and second ranges of body-bias values, respectively, for the first and second circuits from the indications of process, voltage, and temperature for the first and second circuits and from configuration information for the first and second circuits; and a body-bias generator adapted to provide first and second body-bias signals to at least one transistor in, respectively, the first and second circuits, the body-bias signals having values within the respective range of body-bias values of the first and second circuits.

18. The FPGA according to claim 17, wherein the values of the first and second body-bias signals are further based on configuration information about the first and second circuits.

19. The FPGA according to claim 17, wherein the configuration information for at least one of the first and second circuits comprises information about an operating speed of the at least one of the first and second circuits.

20. The FPGA according to claim 17, wherein the configuration information for at least one of the first and second circuits comprises information about a power consumption of the at least one of the first and second circuits.

* * * * *